United States Patent [19]

Lapham et al.

[11] Patent Number: 4,885,106

[45] Date of Patent: Dec. 5, 1989

[54] STORABLE SEMICONDUCTOR CLEANING SOLUTION CONTAINING PERMONOSULPHURIC ACID

[75] Inventors: David J. Lapham, Widnes; Geoffrey Hitchmough, Runcorn, both of United Kingdom

[73] Assignee: Micro-Image Technology Limited, London, United Kingdom

[21] Appl. No.: 147,782

[22] Filed: Jan. 25, 1988

[30] Foreign Application Priority Data

Jan. 27, 1987 [GB] United Kingdom ............... 8701759

[51] Int. Cl.$^4$ .................................................. C11D 7/18
[52] U.S. Cl. ...................................... 252/100; 252/95; 252/142; 252/DIG. 14; 252/186.28; 252/186.29; 423/273
[58] Field of Search ................... 252/100, 133, 79.1, 252/79.2, 89.1, 147, 148, 186.28, 186.29; 134/38, 40, 3; 423/272, 273

[56] References Cited

U.S. PATENT DOCUMENTS

| | | | |
|---|---|---|---|
| 1,958,204 | 5/1934 | Reichert | 423/273 |
| 2,658,818 | 11/1953 | Shanley et al. | 423/273 |
| 2,872,293 | 2/1959 | Roth | 423/273 |
| 3,383,174 | 5/1968 | Carnine et al. | 423/273 |
| 3,387,939 | 6/1968 | Reilly et al. | 423/273 |
| 3,864,271 | 2/1975 | Stalter | 252/99 |
| 4,070,442 | 1/1978 | Watts | 423/272 |
| 4,320,102 | 3/1982 | Dalton et al. | 423/273 |
| 4,442,134 | 4/1984 | Kern | 427/9 |
| 4,770,808 | 9/1988 | McDonogh | 252/186.29 |

*Primary Examiner*—Prince E. Willis
*Attorney, Agent, or Firm*—Kane, Dalsimer, Sullivan, Kurucz, Levy, Eisele and Richard

[57] ABSTRACT

A storable semiconductor cleaning solution consists essentially of sulphuric acid at a concentration of from 30% to 70% and hydrogen peroxide at a concentration of from 1% to 20% preferably also containing a pentavalent phosphorus sequestrant and tin ions. The solution is produced by diluting concentrated sulphuric acid, aging the diluted acid until it reaches a temperature below 30° C. and introducing the hydrogen peroxide, preferably having a concentration of at least 70% by weight, into the aged acid and equilibrating the resulting solution. The cleaning solutions can be stored for an extended period at ambient temperature and can be used to clean semiconductors, and with suitable precautions aluminized semiconductors, at temperatures below 100° C.

5 Claims, 4 Drawing Sheets

Fig. I
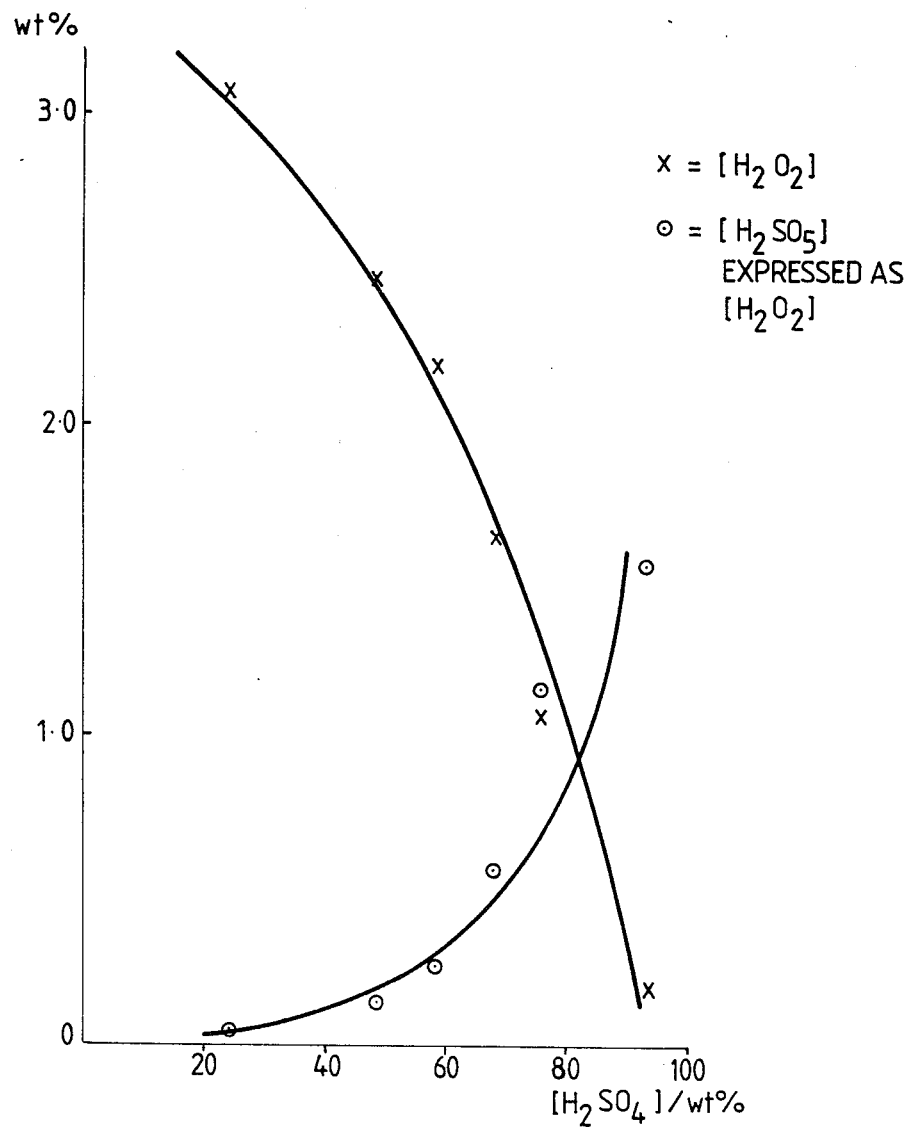

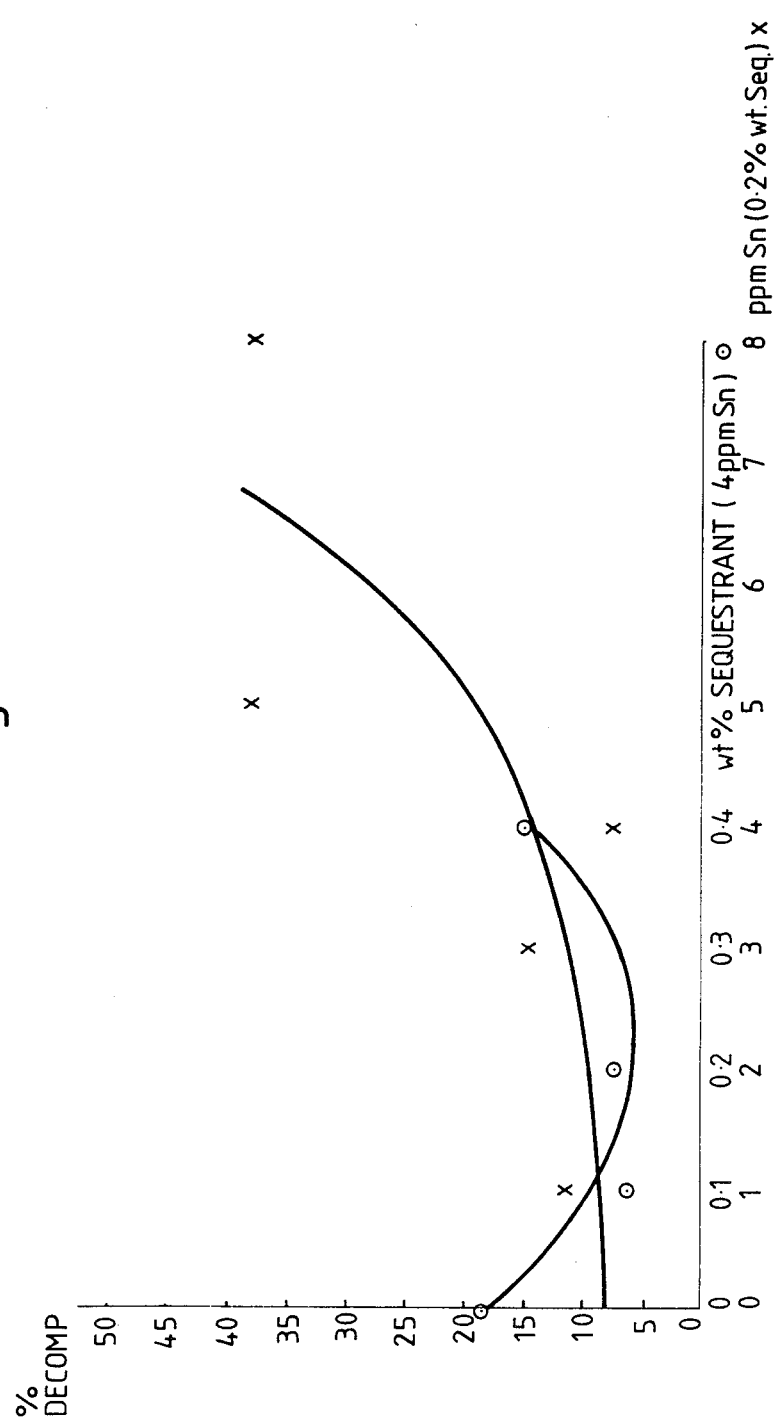

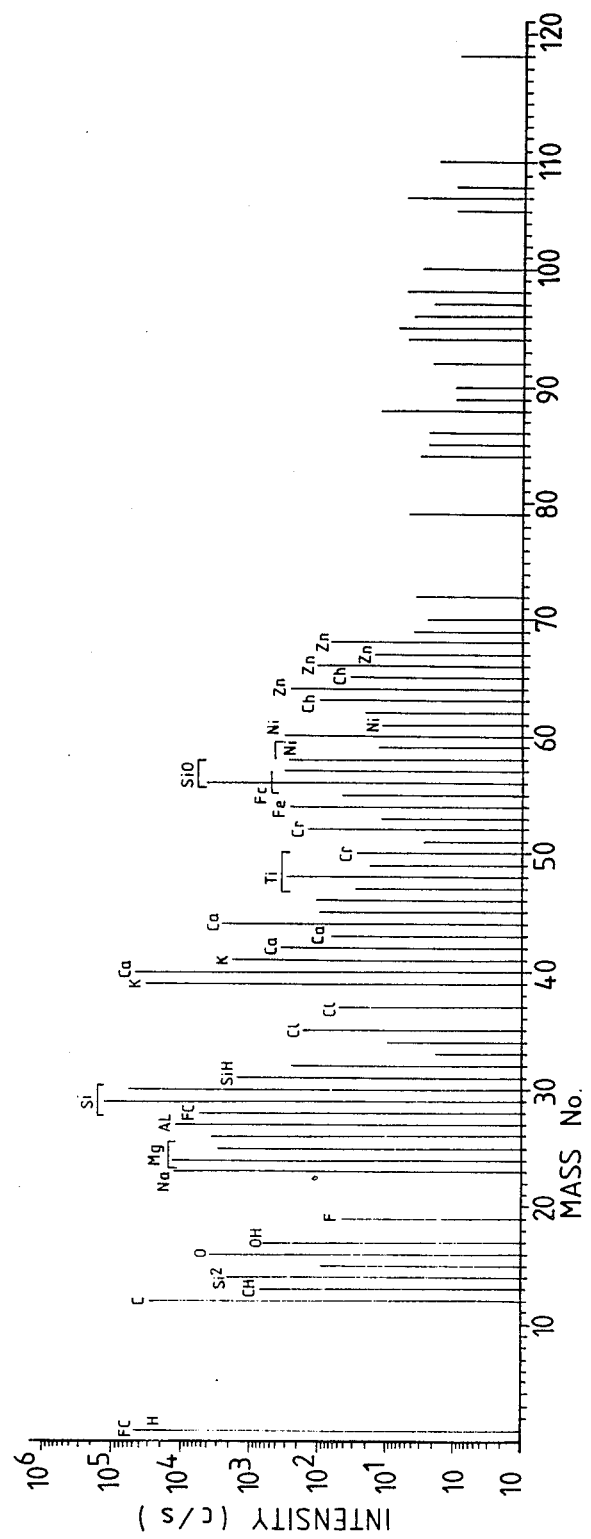

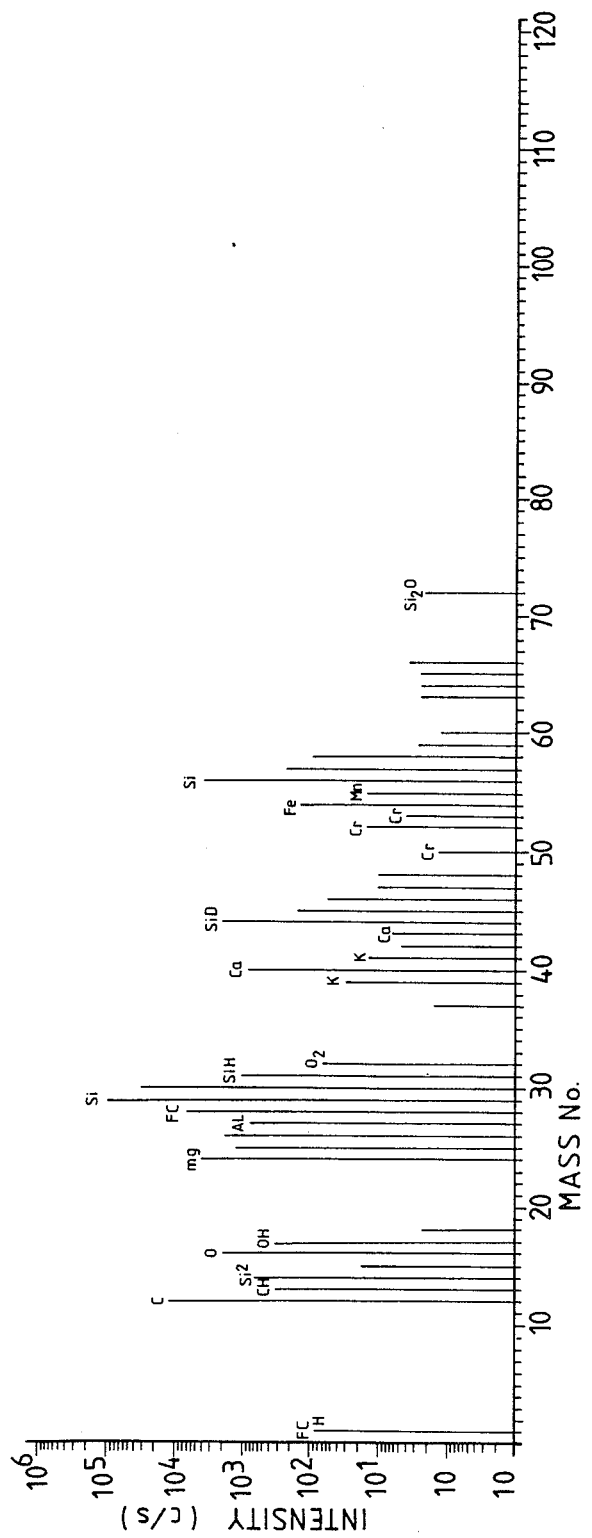
Fig. IV

STORABLE SEMICONDUCTOR CLEANING SOLUTION CONTAINING PERMONOSULPHURIC ACID

BACKGROUND OF THE INVENTION

1. Field of the Invention

This invention relates to a composition for use in the processing of semiconductor materials for use in the production of integrated circuits, more particularly to a semiconductor cleaning solution and to methods for its production and use.

2. Brief Description of the Prior Art

Integrated circuit elements are produced by coating a semiconductor substrate surface, e.g. a silicon wafer, possibly after a layer of conductive metal has been applied to the surface, with a layer of photoresist material, applying to the photoresist surface a pattern corresponding in either the positive or negative sense to the desired circuit element, activating the printed photoresist layer by exposure to suitable activating radiation, such as light or x-rays, to make the printed and unprinted areas of it differentially soluble in a developing solution and treating the activated photoresist layer with the developing solution to remove the soluble areas of the photoresist layer either to expose the substrate surface for the application thereto of the desired circuit element, which may be by deposition of a conductive metal or metal oxide or by ion implantation with, for example, boron ions into the body of the substrate, or to expose a pre-applied conductive layer which may be etched to remove all but the desired circuit element and finally stripping from the semiconductor surface the residue of the photoresist layer. This procedure may be repeated to build up a circuit comprising superimposed circuit elements.

The number of independent electronic circuit elements included in a single integrated circuit design has increased greatly as technology capabilities have progressed from small scale integration through to very large scale integration which may correspond to about $10^5$ transistor elements per semiconductor chip or wafer element. The accompanying decrease in line widths, line spacing and line thickness has led to a great increase in the sensitivity of the finished product to the presence of contaminants on the wafer surface making it increasingly difficult to maintain a reasonable level of yield of finished integrated circuits.

Contaminants may result from a number of sources. They may be, for example, thin, possibly almost monomolecular, films of an organic nature resulting from previous photoresist layer traces or from organic matter emanating from operatives which may be deposited by handling or even from the air. Contaminants may also be particulate in nature and may for example be of an inorganic nature deposited from etchant components.

Because of the necessity to remove, so far as possible, all contaminant traces from a semiconductor surface before the application of a circuit element, a further circuit element or before use, there has developed a specialised range of semiconductor cleaning solutions. While these cleaning solutions may bear superficial resemblances to photoresist stripping solutions they operate on a different principle in that, in the case of stripping solutions using sulphuric acid and hydrogen peroxide, the active species, permonosulphuric acid, is relatively ineffective for cleaning purposes.

Japanese patent publication No. 61-105847 describes a process for cleaning semiconductor surfaces comprising producing hot sulphuric acid having a typical concentration of from 97.4% to 98% by weight by the addition of water to oleum, the heating of the acid being a result of the reaction between the water and the sulphur trioxide in the oleum, to generate sulphuric acid, mixing the hot concentrated acid with aqueous hydrogen peroxide at a position adjacent to the surface to be cleaned, thereby generating further heat as a result of the dilution of the concentrated acid, to give a treating mixture having a temperature, essentially, of at least 100° C., and contacting the surface with that treating mixture. Under such circumstances there is almost instantaneous decomposition of the hydrogen peroxide to produce nascent oxygen as an active cleaning species.

U.S. Pat. No. 3728154 describes a process for cleaning semiconductor surfaces using freshly prepared diluted sulphuric acid having a temperature deriving from the heat of dilution of 150° C. the use being completed by the time the temperature has decayed to 130° C. The freshly prepared diluted acid is postulated in the patent to have special properties and if it is allowed to cool to room temperature it is highly ineffective and if it is then reheated to 150° C. it is much less effective than the original fresh solution.

Long term storage semiconductor cleaning solutions based on sulphuric acid and hydrogen peroxide are not known and it is an object of the present invention to provide such and a method for their production.

SUMMARY OF THE INVENTION

According to one aspect thereof the present invention provides a storable semiconductor cleaning solution consisting essentially of water, sulphuric acid at from 25% to 70% concentration but preferably from 30% to 70% concentration by weight, and hydrogen peroxide at from 1% to 20% concentration by weight. According to a further aspect of the presentinvention the said cleaning solution also contains a sequestrant and tin ions. According to yet a further aspect the present invention provides a method of producing storable semiconductor cleaning solutions utilising diluted sulphuric acid.

BRIEF DESCRIPTION OF THE DRAWINGS

FIG. I is a graph showing the variance of hydrogen peroxide concentration and permonosulphuric acid concentration (expressed as hydrogen peroxide) with the concentration of sulphuric acid in a number of solutions of the invention.

FIG. II is a graph showing the percentage of decomposition of solutions of the invention, having various concentrations of tin ions and sequestrant and under elevated temperature conditions.

FIG. III is a bar graph showing the SIMS analysis results obtained from a contaminated silicon wafer.

FIG. IV is a bar graph showing the SIMS analysis results obtained from a silicon wafer as carried out in FIG. III, but after cleaning the wafer with a solution of the invention.

DETAILED DESCRIPTION OF THE PREFERRED EMBODIMENTS OF THE INVENTION

The concentration of sulphuric acid in the cleaning solution of this invention is of importance, firstly since it exerts a cleaning action in its own right and therefore requires to be present in a reasonable concentration and secondly because the quantity of water in the solution, by virtue of the use of sulphuric acid of a limited degree of concentration only, exerts a fundamental effect on the reversible reaction $$H_2SO_4 H_2O_2 \rightleftharpoons H_2SO_5 + H_2O$$

to push the equilibrium towards the left thereby avoiding the undue conversion of hydrogen peroxide, useful for cleaning purposes, into permonosulphuric acid. This effect is illustrated in FIG. I attached hereto which shows the variance of hydrogen peroxide concentration and permonosulphuric acid concentration (expressed as hydrogen peroxide) with the concentration of sulphuric acid included in the following cleaning solution produced according to the present invention, as hereafter taught, by the prior production of 200 ml 76% wt. sulphuric acid the addition thereto of 6.5 ml 86% hydrogen peroxide containing sequestrant and tin and the equilibration of the solution for 5 hours at 70° C. In view of the above conflicting requirements the concentration of the sulphuric acid is preferably below 70% by weight and to achieve enhanced hydrogen peroxide levels may advantageously be below 65% or even below 60% by weight. Given a suitable sulphuric acid concentration the level of hydrogen peroxide in the solution may be increased by introducing more hydrogen peroxide. However cleaning solutions containing more than 20% by weight of hydrogen peroxide tend to be physically and chemically unstable and less than 1% of hydrogen peroxide is insufficient for the intended purpose. Preferably the cleaning solution of the invention contains sulphuric acid in at least 35% by weight and hydrogen peroxide in from 1% to 17% by weight.

If the cleaning solution of the invention contains only extremely low contents of metal ions and/or of particles for example, less than that indicated as particularly preferred in Tables I and II hereafter, it tends to be storage stable at ambient temperature for a considerable period of time and to exhibit only a low degree of decomposition of hydrogen peroxide, for example 4.6% after storage at 70° C. for 5 hours. Under practical production conditions due to variations in reagent quality and in working practices this standard may occasionally not be achieved, resulting in some degree of storage instability. Additionally, contamination during use may cause instability resulting in shortened bath life.

It has been found that instability due to metal contamination may be reduced by including in the cleaning solution both a sequestrant and tin ions. In the absence of the sequestrant the tin ions themselves cause instability but in the absence of tin other metal ions can cause instability despite the presence of the sequestrant.

It is further found that the quantity of sequestrant is important in that too low a quantity, below about 0.1% by weight of the solution, fails to stabilise while too high a quality, above about 0.5% of sequestrant tends to give increased decomposition. It was also found that low levels of tin ions for example from 0.02 to 0.2 ppm (parts per million) by weight of the solution have an effect to shift the reaction equilibrium in favour of hydrogen peroxide although high concentrations, above about 0.2 ppm of Sn by weight of the solution, result in increased hydrogen peroxide decomposition. It may be found preferable to use hydrogen peroxide containing tin ions in from 0.5 to 5 ppm particularly preferably from 0.5 to 4 ppm by weight of the hydrogen peroxide in the practice of this invention. Preferably the source of tin ions is a water-soluble stannate for example an alkali metal stannate such as sodium stannate in a suitable quantity to give the above stated Sn concentrations.

Since the presence of chlorine in the cleaning solution tends to have very adverse effects on any desired aluminium metallisation on the semiconductor the content of chlorine in the sequestrant, and indeed in any other ingredient in the cleaning solution, should not exceed 0.1 parts per million by weight.

The sequestrant must be suitable for use in the aggresive environment of the cleaning solution which can, at higher $H_2SO_4$ concentrations cause decomposition of some commonly used sequestrants for exampl hydroxy benzoic acid esters. A suitable range of sequestering agents are organic compounds containing acidic pentavalent phosphorus-containing groupings, for example, preferably, phosphonic acid (HPO.(OH)$_2$) groupings and preferaly containing from 2 to 5 such groupings. The hydroxyls of the phosphonic acid groupings may optionally be substituted by other active hydrogen containing groupings for example ammonium.

Preferably the two or more acidic pentavalent phosphorus-containing groupings are linked via alkylene or substituted alkylene groupings, which groupings preferably contain from 1 to 4 carbon atoms and may preferably be methylene, dimethylene, or ethylidene, for example hydroxy ethylidene

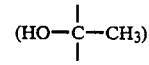

groupings.

In the case of compounds containing 3 or more acidic pentavalent phosphorus-containing groupings such compounds preferably comprise a linking tertiary nitrogen atom or atoms attached to said alkylene groups.

Examples of such compounds are the range of sequestrants available under the Trade Name Dequest, for example Aminotri(methylene phosphonic acid)—(Dequest 2000)
Ammonium salt of ethylenediamine tetra(methylene phosphonic acid—(Dequest 2042)
Ammonium salt of hexamethylenediamine tetra(methylene phosphonic acid)—(Dequest 2052)
Diethylene triaminepenta(methylene phosphonic acid)—(Dequest 2060)
but preferably
1-hydroxylethylidene 1,1-Diphosphonic acid (Dequest 2010).

According to yet a further aspect of the present invention the cleaning solution also preferably contains one or more surfactants to improve the surface contact between the cleaning solution and the semiconductor surface. Preferably the surfactant is present in from 2% to 20% by weight of the solution. The surfactant is preferably selected so as to be compatible with the hydrogen peroxide solution. Preferably the surfactants are selected from the anionic surfactants for example the sulphonates $R_4SO_3M$ wherein M is an alkali metal, ammonium or amine and R is a hydrocarbon group. Suitably the hydrocarbon group has a $C_{10}$–$C_{26}$ carbon-carbon chain. Suitable sulponates are the alkylbenzene sulphonates, e.g. the $C_{12}$ alkyl benzene sulphonate. Alternatively the surfactant may be a nonionic surfactant such as an ethoxylate for example an ethoxylated aliphatic alcohol or fluoroalcohol where the aliphatic grouping is a $C_{12}$ to $C_{26}$ carbon-carbon chain.

In order to provide a good storage life for the cleaning solution as well as to avoid contamination of the semiconductor surface by the use thereof the cleaning solution of the present invention is preferably further characterised by the features of a low concentration of transition metals, calculated as the elements, as set out in Table 1 hereafter and of a low concentration of particles as set out in Table 2 hereafter.

The metal and particle concentrations referred to may be attained by the use of electronic grade chemicals and water having the required characteristics as ingredients of the compositions.

TABLE I

| Metal | Maximum concentration - parts per billion wt | | |
|---|---|---|---|
| | Preferred | Particularly preferred | Optimal |
| Cobalt | 100 | 50 | 10 |
| Chromium | 100 | 50 | 10 |
| Copper | 100 | 50 | 10 |
| Iron | 1000 | 500 | 100 |
| Manganese | 100 | 50 | 10 |
| Nickel | 100 | 50 | 10 |
| Zinc | 500 | 250 | 50 |

TABLE II

| Particle concentration maxima (number ≦ given size in 10 ml) | | |
|---|---|---|
| Particle size Microns | Preferred | Particularly preferred |
| 0.5 | 2000 | 1500 |
| 1.0 | 500 | 300 |
| 2.0 | 120 | 70 |
| 5.0 | 16 | 10 |
| 10.0 | 4 | 2.5 |
| 15.0 | 1.7 | 1 |

In preparing the cleaning solutions of the present invention it is preferred to prevent any sufficient increase in temperature to cause the decomposition of the hydrogen peroxide and the evolution of nascent oxygen. It is therefore important to add the hydrogen peroxide to a body of the sulphuric acid while controlling the addition and if necessary cooling to maintain the temperature below 30° C. preferably below 20° C. and particularly preferably below 15° C. Heat decomposition of the hydrogen peroxide during the production of the solution, even to a small extent, may greatly reduce the storage stability and eventual effectiveness of the solution in use.

Cleaning solutions according to the invention may be produced by the addition of the hydrogen peroxide or of the hydrogen peroxide and any necessary water to concentrated sulphuric acid, the addition being carried out slowly and the mixture being stirred and cooled to maintain the general temperature of the solution within the above limitations. It is surprisingly found however, that a particularly stable cleaning solution may be produced by diluting the concentrated sulphuric acid with the required amount of water, preferably to a concentration below 80% wt, having regard to the concentration and quantity of the intended hydrogen peroxide addition, to give the intended product and to age the diluted acid until its temperature has dropped, preferably to below 30° C. and particularly preferably below 20° C. before the addition of the hydrogen peroxide.

Preferably the hydrogen peroxide used in this embodiment of the invention is of at least 65% suitably at least 70% wt concentration although, of course, lower concentrations of hydrogen peroxide may be used. Preferably the addition of the hydrogen peroxide is conducted progressively, with stirring and if necessary with cooling, to prevent the temperature rising above 30° C. Preferably the resulting solution is aged to allow equilibration of the hydrogen peroxide and of the sulphuric acid before packing. Contrary to the indications in U.S. Pat. No. 3728154 referred to above, the cleaning effect of the resulting solution is not deleteriously effected by the use of prediluted acid. A cleaning solution produced as above described, preferaly also containing the combination of sequestrant and tin ions above referred to, may be stored at ambient temperature for an extended period in excess of 2 months and often up to 1 year.

In order to investigate the effect of varying the concentrations of tin ions and of sequestrant in cleaning solutions of this invention a number of solutions were prepared by the sequential addition to a stirred vessel of 1. 200 ml 76% wt $H_2SO_4$ previously prepared by dilution of 98% wt acid and cooled to ambient temperature, 2. Dequest 2010

3. 6.5 ml 86% wt $H_2O_2$ containing tin ions as the stannate, the temperature being maintained by progressive addition of the hydrogen peroxide with cooling of the vessel, below 30° C. with variations of the quantity of Dequest 2010 as % by wt of 1.+2. and of the quantity of the tin ions as ppm by weight of 2.

The solutions were analysed, subjected to accelerated equilibration for 5 hours at 70° C. and reanalysed to determine the % decomposition of the hydrogen peroxide.

The results are shown in FIG. II from which it is seen that, to avoid substantial decomposition, the concentration of Dequest is preferably greater than 0 but not substantially greater than about 0.4 ppm and the concentration of tin is preferably less than about 5 ppm Sn in the hydrogen peroxide corresponding to less than about 20% decomposition.

In a further experiment a content of Dequest of 0.1% wt and of tin of 1 ppm Sn gave a decomposition of only 4.2% under the same conditions.

The role of tin ions in protecting the cleaning solution of the invention from the effect of other metal ions is illustrated by the following experiments.

A cleaning solution was made up as last above described using the same quantities and strengths of $H_2SO_4$ and $H_2O_2$, 0.2% by weight of Dequest 200 sequestrant and 4 ppm by weight, based on the hydrogen peroxide solution of stannous ions calculated as Sn. Additionally, the contents of other metal ions as the sulphate expressed as the metal and based on the total solution, set out in the following Table were added. The % decomposition of the hydrogen peroxide originally included, after 5 hours equilibration at 70° C. is also given in Table III.

TABLE III

| Added metal ions | Decomposition/wt % |
|---|---|
| 2 ppm Cu | 89 |
| 4 ppm Cu | 94 |
| 2 ppm Al | 9.5 |
| 6 ppm Al | 12 |
| 2 ppm Cu + 2 ppm Al | 51 |

TABLE III-continued

| Added metal ions | Decomposition/wt % |
| --- | --- |
| 4 ppm Cu + 4 ppm Al | 52 |

In a repetition of the 6 ppm Al experiment the tin ions were omitted. The % decomposition was 37%. It is concluded that the presence of aluminium ions alleviates the effect of copper ions and that the presence of tin alleviates the effect of aluminium ions. The cleaning solutions of this invention are therefore suitable for use in relation to particular aluminised semiconductor materials.

It is also a feature of this invention that the cleaning solution may be used at relatively low temperatures, preferably from 10° C. to 30° C. particularly preferably from 12° C. to 25° C. At such temperatures the cleaning effect, particularly of cleaning solutions of the invention which contain a phosphonate sequestrant, a source of soluble tin, and preferably, a surfactant, is long lasting and a plurality of semiconductor cleaning cycles may be conducted with the same body of cleaning solution. In contrast it has been the practice to utilise high temperatures, of for example 100° C. to 105° C., at which temperatures any hydrogen peroxide would decompose during the cleaning operation so that the practice would be to discard the cleaning solution after a single cleaning cycle. It is, of course, open to users of the cleaning solution of the present invention to use these high operational temperatures, or intermediate temperatures of for example above 30° C. but below 100° C., at all of which temperatures excellent relative stability properties may be observed.

A cleaning solution according to the invention comprising 31.25 cm$^3$ H$_2$O, 18.75 cm$^3$ 98% wt H$_2$SO$_4$, 50 cm$^3$ 35% wt H$_2$O$_2$, 0.2% Dequest 2010 and 4 ppm tin as a stannous compound was used to clean silicon wafers contaminated by fingerprints and bearing scratches by a variety of metals—by immersion for 15 minutes at 80° C. followed by a rinse with pure water. The contaminated wafer and the cleaned wafer were subjected to SIMS Analysis as known in the art. The results are shown in bar graph form in FIGS. III and IV attached hereto. FIG. III being the result from the contaminated wafer and FIG. IV being the result of cleaning according to the invention. The effectiveness of cleaning shown in FIG. IV is at least on a par with the standard required in the art. A sample of the cleaning solution identical to that used in the above test showed substantially no reduction in % active peroxygen over 100 days storage at room temperature with no sign of instability at the end of that period.

We claim:

1. A storable permonosulphuric acid-containing semiconductor cleaning solution, consisting essentially of;
   an initial solution of water;
   from 30 percent to 76 percent by weight sulphuric acid; and
   from 1 percent to 20 percent by weight hydrogen peroxide;
   stabilized by a stabilizer combination consisting essentially of
   (a) from 0.1 percent to 0.4 percent by weight of the solution of a organic pentavalent phosphorus-containing sequestrant; and
   (b) 0.5 to 4 parts per million of a soluble tin compound, calculated as tin by weight of the initial hydrogen peroxide.

2. A cleaning solution as claimed in claim 1 wherein the sulphuric acid is present at not more than 65% by weight.

3. A cleaning solution as claimed in claim 1 wherein the hydrogen peroxide is present at not more than 17% by weight.

4. A cleaning solution as claimed in claim 1 containing not more than 0.2 ppm of a soluble tin compound expressed as Sn.

5. A cleaning solution of claim 1 wherein the ingredients are of an electronic purity grade.

* * * * *